US011340279B1

(12) United States Patent
Fitzgerald et al.

(10) Patent No.: US 11,340,279 B1
(45) Date of Patent: *May 24, 2022

(54) ELECTRICAL SHOCK DETECTION DEVICE AND METHODS

(71) Applicant: MARINE CO. SYSTEMS, LLC, Bessemer, AL (US)

(72) Inventors: Matthew Bruce Fitzgerald, Hoover, AL (US); Amar Thors, Birmingham, AL (US); Roger Alan Miller, Helena, AL (US); John David Cook, Gardendale, AL (US); Daniel James Myers, Hoover, AL (US)

(73) Assignee: Marine Co. Systems, LLC, Bessemer, AL (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/945,564

(22) Filed: Jul. 31, 2020

Related U.S. Application Data

(63) Continuation-in-part of application No. 16/514,604, filed on Jul. 17, 2019, now Pat. No. 10,768,210.
(Continued)

(51) Int. Cl.
*G01R 31/00* (2006.01)
*G08B 7/06* (2006.01)
(Continued)

(52) U.S. Cl.
CPC ........... *G01R 31/001* (2013.01); *G01R 29/12* (2013.01); *G08B 7/06* (2013.01); *G08B 21/02* (2013.01); *G06F 3/14* (2013.01)

(58) Field of Classification Search
CPC .. G08B 21/082; G08B 29/185; G08B 21/182; G08B 25/016; G08B 25/10;
(Continued)

(56) References Cited

U.S. PATENT DOCUMENTS 6,329,924 B1   12/2001   McNulty
9,678,119 B2 *  6/2017   King, Jr. ............ G01R 19/0084
(Continued)

FOREIGN PATENT DOCUMENTS

KR       100928006      11/2009

OTHER PUBLICATIONS

Dock Lifeguard, materials provided with product packaging for the Dock Lifeguard Shock Warning System, purchased around Aug. 27, 2020 Aug. 27, 2020.
(Continued)

*Primary Examiner* — John W Poos
(74) *Attorney, Agent, or Firm* — Jake M. Gipson; Paul Sykes; Bradley Arant Boult Cummings LLP

(57) ABSTRACT

A device for detecting stray electrical currents in fluid mediums comprises at least two probes for partially disposing in a fluid medium and a control unit. The control unit comprises at least one analog-to-digital signal converter in electrical communication with at least one of the probes, at least one audio-visual alarm, and a processor operably coupled to the at least one converter and to the at least one audio-visual alarm. The processor is operable to measure an electrical potential difference between the two probes, to calculate at least one frequency-dependent characteristic associated with a plurality of said measurements, and to transmit an alert signal if the at least one frequency-dependent characteristic satisfied a threshold. Advantageously, by monitoring for the frequency, the device more consistently and more reliably detects the presence of stray alternating currents.

38 Claims, 11 Drawing Sheets

Related U.S. Application Data

(60) Provisional application No. 62/699,256, filed on Jul. 17, 2018.

(51) Int. Cl.
*G01R 29/12* (2006.01)
*G08B 21/02* (2006.01)
*G06F 3/14* (2006.01)

(58) Field of Classification Search
CPC ........ G08B 25/009; G08B 25/08; G08B 1/08; G08B 21/18; G08B 29/26; G08B 17/10; G08B 25/008; G08B 25/001; G08B 29/181; G01R 19/145; G01R 19/155; G01R 19/1659; G01R 19/0084; G01R 19/165; G01R 31/52; G01R 31/50
See application file for complete search history.

(56) References Cited

U.S. PATENT DOCUMENTS

| | | | |
|---|---|---|---|
| 9,799,193 B2* | 10/2017 | King, Jr. | G08B 21/02 |
| 9,836,943 B1 | 12/2017 | Branstetter et al. | |
| 9,959,734 B1* | 5/2018 | Figura | G08B 21/082 |
| 10,288,662 B2* | 5/2019 | King, Jr. | G01R 19/155 |
| 10,529,214 B2* | 1/2020 | King, Jr. | G01R 27/08 |
| 2011/0025519 A1 | 2/2011 | Donaldson | |
| 2017/0169685 A1 | 6/2017 | Easton et al. | |
| 2017/0205454 A1 | 7/2017 | Rachakonda et al. | |
| 2017/0353027 A1 | 12/2017 | McTighe, Jr. et al. | |

OTHER PUBLICATIONS

Shock Alert, advertising material related to the Shock Alert device; 1 page; obtained no later than Jun. 2018.
Dock IQ, advertising brochure related to ShockIQ detection system; 1 page; obtained in Jan. 2019.

* cited by examiner

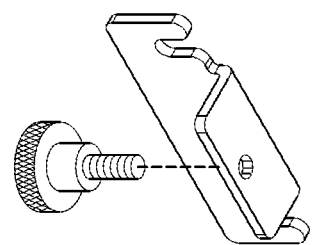
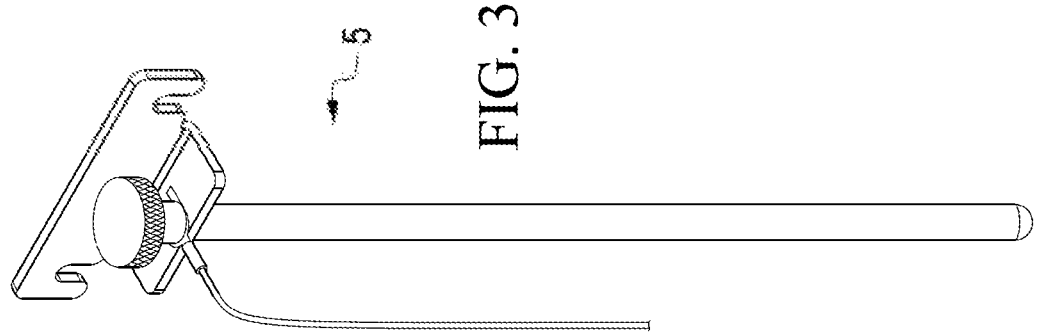
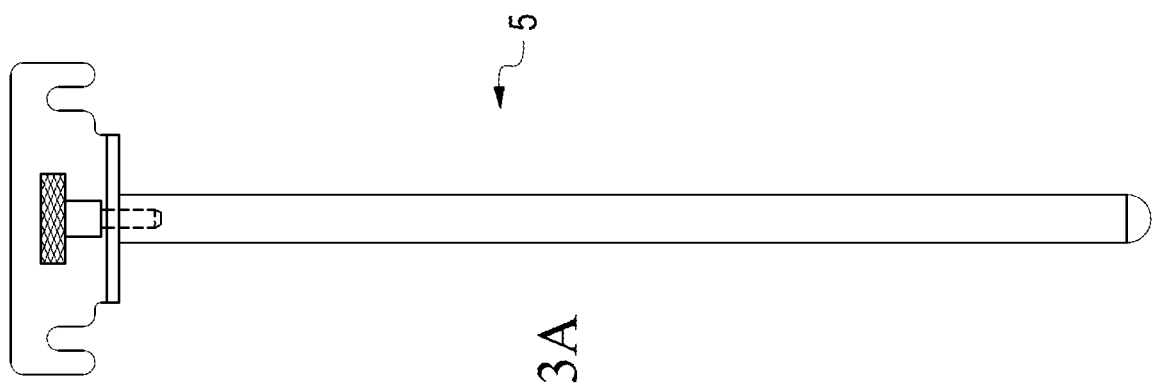
FIG. 3C
FIG. 3B
FIG. 3A

ELECTRICAL SHOCK DETECTION DEVICE AND METHODS

CROSS-REFERENCE TO RELATED APPLICATIONS

This application claims the benefit of and priority to U.S. Non-Provisional patent application Ser. No. 16/514,604, entitled "Electrical Shock Detection Device and Methods" and filed on Jul. 17, 2019, and U.S. Provisional Patent Application No. 62/699,256, entitled "Electrical Shock Detection Device and Methods" and filed on Jul. 17, 2018. The entire contents of the foregoing applications are incorporated by reference.

FIELD OF THE DISCLOSURE

The present disclosure relates to shock detection devices, systems, and methods, and more particularly to devices, systems, and methods for detecting the presence of electrical currents in water and other fluid mediums.

BACKGROUND OF THE INVENTION

Electric shock drowning causes multiple fatalities every year, most commonly in bodies of fresh water. It is caused by the presence of dangerous electric currents in the water. Most often, the dangerous currents are alternating current, but direct currents can be dangerous too. These currents may be discharged into the water from numerous sources, such as from an extension cord dropped into the water, faulty wiring on a residential or commercial dock, or shorts in the wiring of a vessel or a fixture (e.g. an underwater light). When a person in freshwater is exposed to an electrical current, the current tends to flow through the human body because the body has less resistance than the surrounding water. An alternating current that passes through the body paralyzes the muscles, causing the person to sink and drown. In some instances, the voltage in the water (whether from direct or alternating current) may also be great enough that the shock causes death.

To address this danger, various devices or systems have been developed to detect the presence of conditions that may cause electrical shock drowning. These systems most often work by detecting a voltage, voltage gradient, or current in the water. If the voltage or gradient exceeds a preset threshold, the system triggers an alarm or another indicator to alert of the dangerous condition.

Although these systems are able to detect stray currents in some environments, their effectiveness is limited by various factors. One limitation arises due to the difficulty in controlling for false alarms. Environments typically include a certain amount of background noise with respect to the voltage or current detected in the water, but the exact amount of noise varies between environments and even locations in a particular environment. Systems attempt to account for this noise by having a static trigger threshold, which is preselected to balance the risk of false alarms with the risk of failing to detect a dangerous condition. This static, one-size-fits-all approach, however, fails to account for a system's specific operating environment. In high noise environments, the system may be more likely to trigger false alarms. In low noise environments, the system may fail to trigger an alarm even though a detected voltage or current clearly exceeds the background noise.

A second, related limitation is the relatively small, and usually unknown, detection range of the systems. Depending on the mineral content and other factors that affect the conductivity of water, voltage and current dissipate quickly. So the further an electrical source is from the system, the less voltage or current that will be detected by the system. As a result, at a certain distance, the magnitude of the voltage or current from an electrical source becomes difficult to distinguish from noise and will not exceed the preset threshold. Often, the effective range of these systems is approximately 20 feet or less. But as with noise, the effective range can vary significantly depending on the environment. In some environments, the effective range may be significantly greater, but in many others, it will be significantly less. Unfortunately, users usually have no way of knowing the effective range in a specific environment.

The limitations associated with false alarms and detection ranges are further exacerbated by the limitations associated with commercially affordable equipment. In order to keep the price of systems within commercially viable price points, components must be selected with price in mind. These commercially viable systems ordinarily have a sensitivity of approximately 2 millivolts. To achieve greater sensitivity, more precise components would be required and are typically much more costly. So even where it may be theoretically possible to improve the sensitivity of the system, there is a practical limitation on sensitivity that cannot be avoided without significantly increasing costs.

Further, many systems may be impacted by their connection to a main power source, such as the electrical circuit on a dock (rather than a battery). Although such an installation can be advantageous because it provides continuous power to the system, it may affect the performance of the system. In many cases, these systems use the ground of the main power as a reference for zero. But in the event of any faults associated with the main power source, such as the presence of a charge on the ground, the system may fail to detect dangerous currents or trigger false alarms.

Even where a system does detect a dangerous condition, it may take insufficient action. In most systems, the system provides only a visual alarm, an audible alarm, or perhaps both. Such an alarm may be sufficient if a user is in the immediate vicinity and not already in the water. But if the user is not around, he may never know that a dangerous condition existed. Particularly if the dangerous condition is intermittent, the user may be unsuspecting the next time he enters the water. Likewise, if a user is already in the water when the system alarms, the visual or audible alarm does little to protect the user from the dangerous condition.

Consequently, there is a need in the art for a shock detection device and methods that do not suffer the limitations that are inherent in detecting electrical sources based on voltage or current. Preferably, the device and methods would allow for more reliable detection of dangerous alternating currents, while also providing detection at greater ranges. Even more preferably, the device and methods may include dynamic self-configuration based on specific operating environments, and in some cases, users may even be alerted about the detection range of the device. The device may also be capable of being connected to a main power supply without impairing its detection circuit, may provide more remote notifications to users, and may disable known power sources.

SUMMARY OF THE INVENTION

The present disclosure describes a shock detection device and methods for detecting electrical sources in water. Advantageously, the device and method use frequency to detect the presence of stray alternating currents. By using frequency, the device and method are able to detect stray currents with greater reliability and at greater distances. The device and method may also include self-configuration features that adapt to the current operating environment, and the user may be notified about the detection range of the device. The detection circuit of the device may also be electrically isolated from any main power supplies. In some cases, the device and method may also include features that send remote notifications or that disconnect known power sources when an electrical current is detected. Embodiments of the invention may thus satisfy one or more, but not necessarily all, of the needs and capabilities described throughout this disclosure.

In some embodiments, a shock detector device comprises a pair of probes for at least partially disposing in a fluid medium and a processor electrically coupled to the pair of probes, wherein the processor is configured to collect a plurality of samples of an electrical potential difference between the pair of probes, and wherein the processor is configured to detect the presence of a specific frequency in the plurality of samples. The specific frequency may be a 60 Hz frequency, a 50 Hz frequency, or any other frequency of interest. The probes may be spaced apart by at least 5 feet, although other distances may be used too. In some embodiments, the probes are spaced between about 0.5 feet and 50 feet apart. The processor may also be operably connected to at least one audio-visual alarm that provides either an audible or visual stimulus to alert individuals in the vicinity of the control unit to the presence of a potentially dangerous condition. Examples of audio-visual alarms include one or more of a siren, a speaker, a light (such as a strobe or an LED light), a display, or another alarm or audible or visual indicator. The processor may also be coupled to one or more transceivers, and the processor may be configured to transmit an alert signal through any of the foregoing devices when a specific frequency is detected. Optionally, the processor may also be configured to measure the amplitude of the plurality of samples.

In another embodiment, a method of monitoring for the presence of an electrical current comprises placing a pair of probes at least partially in a fluid medium; collecting a plurality of samples by repeatedly measuring the electrical potential difference between said pair of probes; analyzing said plurality of samples to identify the presence of a specific frequency; and triggering an alarm when said frequency is detected.

The above summary presents a simplified summary to provide a basic understanding of some aspects of the claimed subject matter. This summary is not an extensive overview. It is not intended to identify key or critical elements or to delineate the scope of the claimed subject matter. Its sole purpose is to present some concepts in a simplified form as a prelude to the more detailed description that is presented later.

BRIEF DESCRIPTION OF DRAWINGS

FIGS. 3A-3C: A front view and two detailed views of one probe in an embodiment of the shock detection device.

DEFINITIONS

Figure 1:
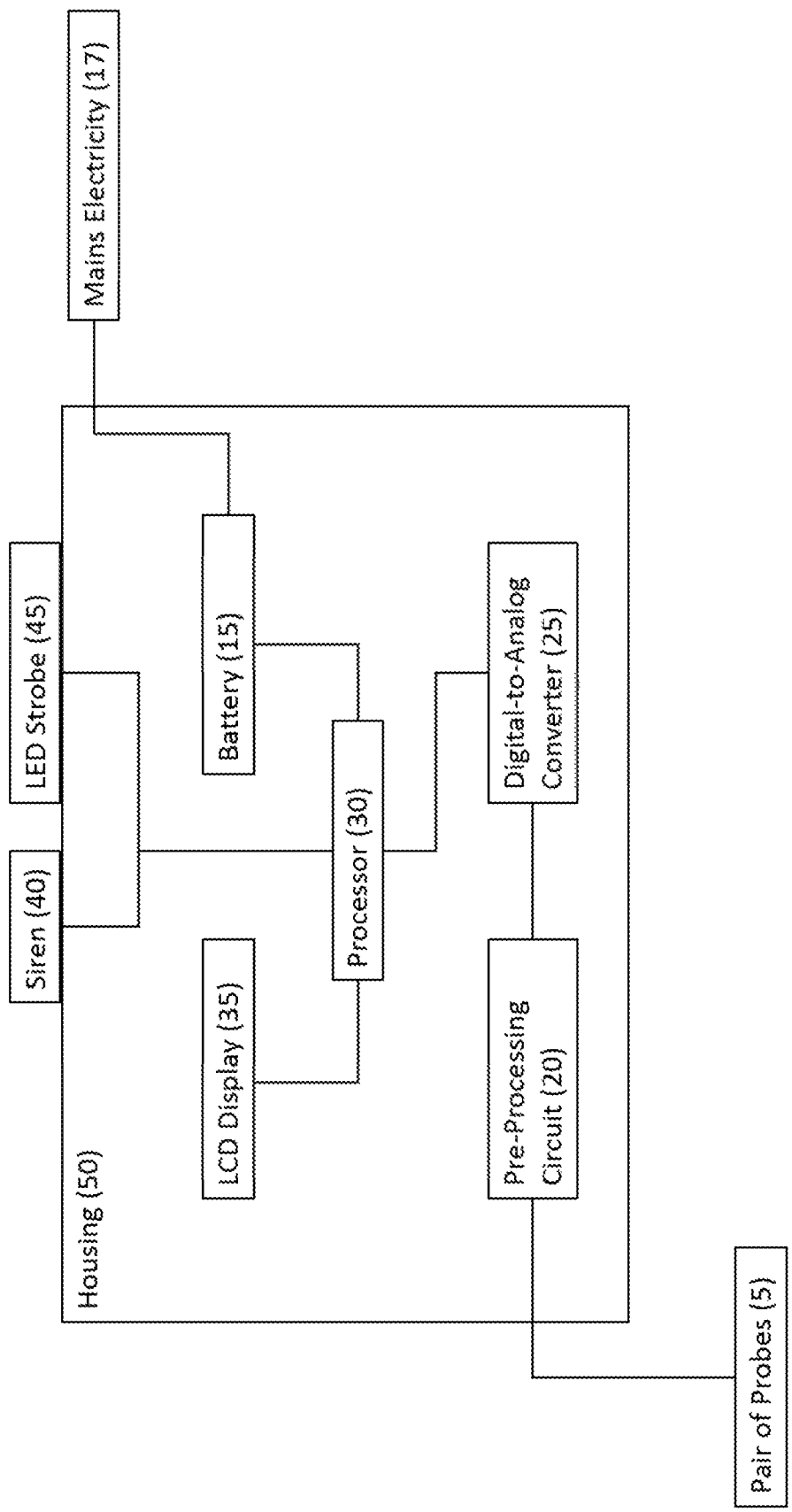
FIG. 1: A block diagram of one embodiment of the shock detection device.
Figure 2:
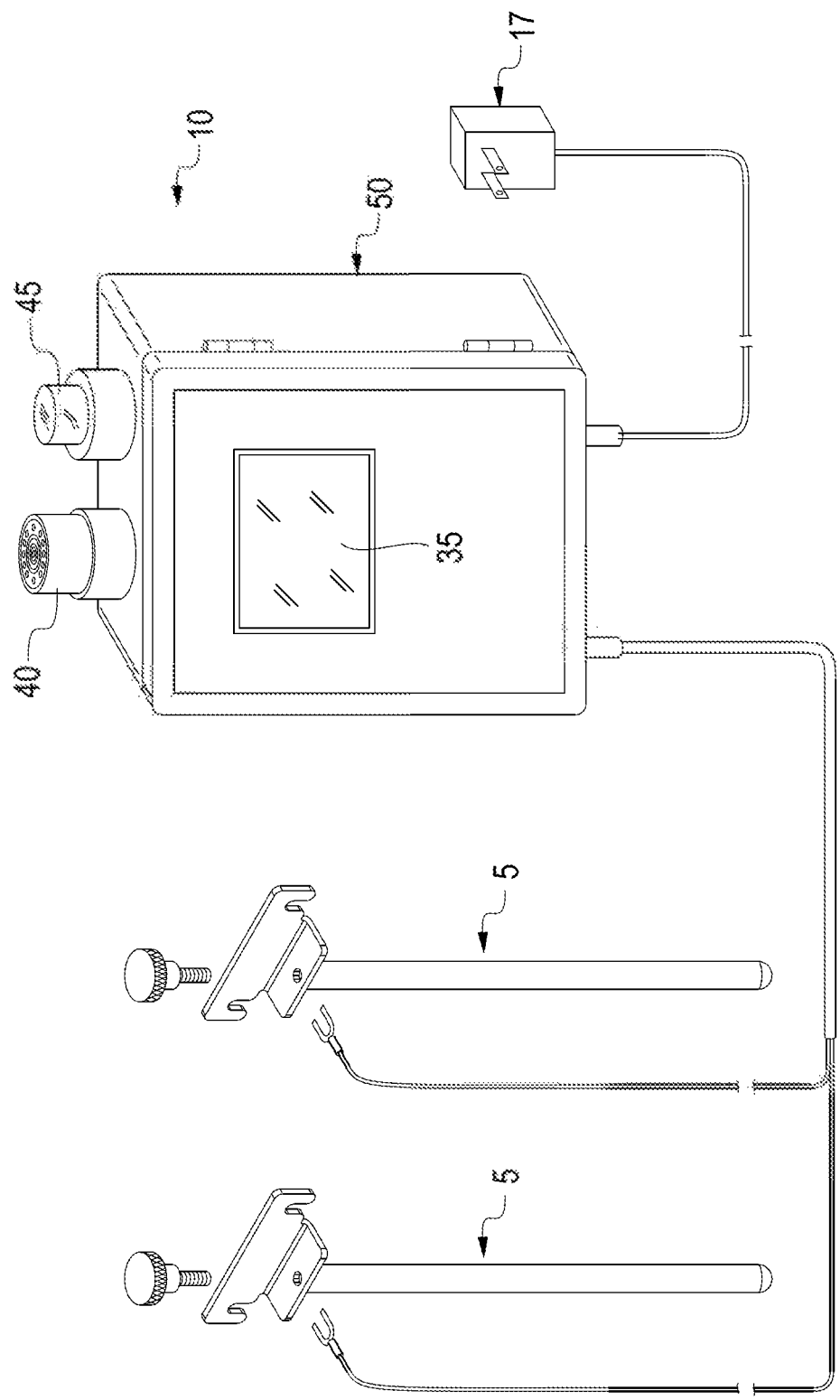
FIG. 2: A perspective view of an exemplary embodiment of the shock detection device.
Figure 4:
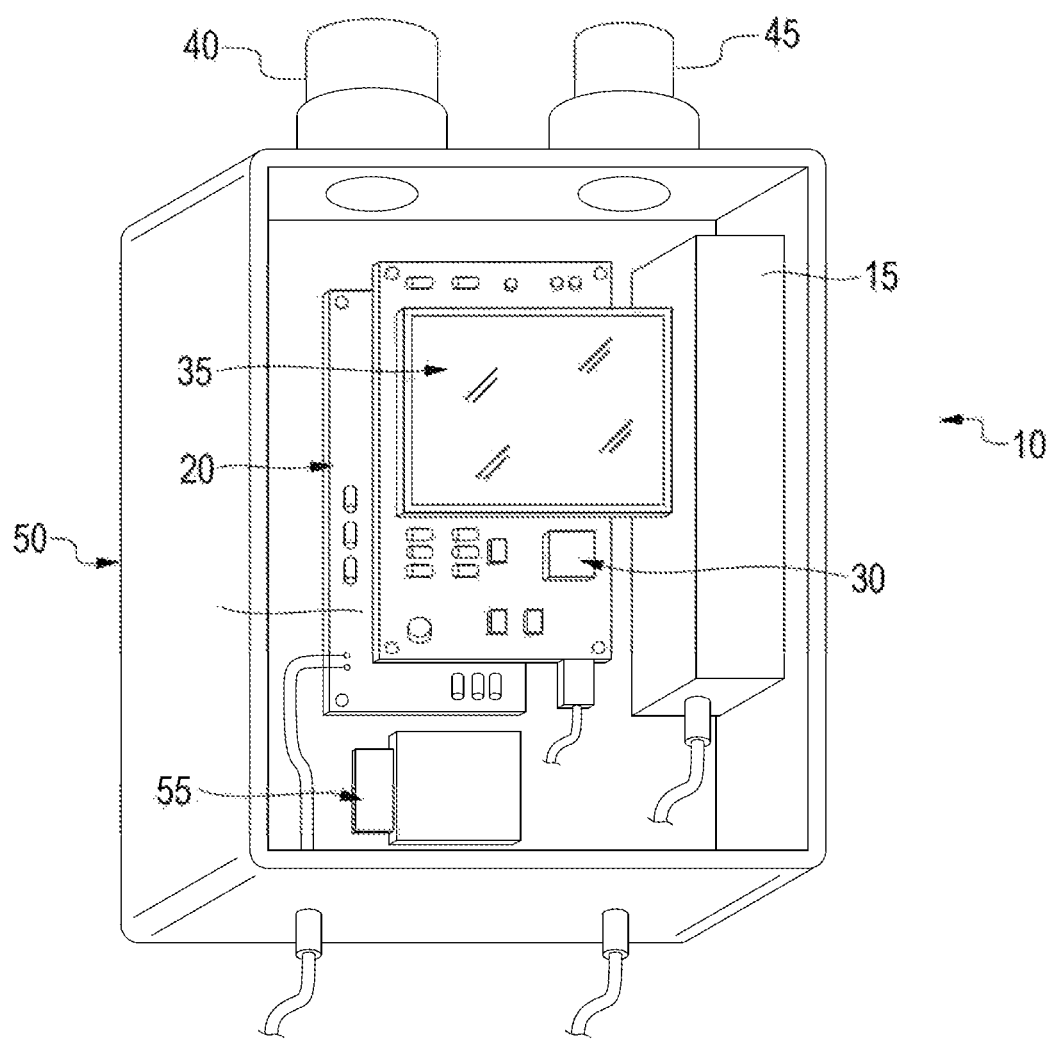
FIG. 4: A perspective view of the control unit of one embodiment of the shock detection device, with the front door of the housing removed.

Unless otherwise defined, all terms (including technical and scientific terms) used herein have the same meaning as commonly understood by one of ordinary skill in the art of this disclosure. It will be further understood that terms, such as those defined in commonly used dictionaries, should be interpreted as having a meaning that is consistent with their meaning in the context of the specification and should not be interpreted in an idealized or overly formal sense unless expressly so defined herein. Well known functions or constructions may not be described in detail for brevity or clarity.

The terms "about" and "approximately" shall generally mean an acceptable degree of error or variation for the quantity measured given the nature or precision of the measurements. Typical, exemplary degrees of error or variation are within 20 percent (%), preferably within 10%, and more preferably within 5% of a given value or range of values. Numerical quantities given in this description are approximate unless stated otherwise, meaning that the term "about" or "approximately" can be inferred when not expressly stated.

The terminology used herein is for the purpose of describing particular embodiments only and is not intended to be limiting. As used herein, the singular forms "a", "an," and "the" are intended to include the plural forms as well, unless the context clearly indicates otherwise.

The terms "first," "second," and the like are used herein to describe various features or elements, but these features or elements should not be limited by these terms. These terms are only used to distinguish one feature or element from another feature or element. Thus, a first feature or element discussed below could be termed a second feature or element, and similarly, a second feature or element discussed below could be termed a first feature or element without departing from the teachings of the present disclosure. Likewise, terms such as "top" and "bottom" are used to distinguish certain features or elements from each other, but it is expressly contemplated that a top could be a bottom, and vice versa.

The term "consisting essentially of" means that, in addition to the recited elements, what is claimed may also contain other elements (steps, structures, ingredients, components, etc.) that do not adversely affect the operability of what is claimed for its intended purpose as stated in this disclosure. This term excludes such other elements that adversely affect the operability of what is claimed for its intended purpose as stated in this disclosure, even if such other elements might enhance the operability of what is claimed for some other purpose.

It is to be understood that any given elements of the disclosed embodiments of the invention may be embodied in a single structure, a single step, a single substance, or the like. Similarly, a given element of the disclosed embodiment may be embodied in multiple structures, steps, substances, or the like.

The following description illustrates and describes the processes, machines, manufactures, compositions of matter, and other teachings of the present disclosure. Additionally, the disclosure shows and describes only certain embodiments of the processes, machines, manufactures, compositions of matter, and other teachings disclosed, but as mentioned above, it is to be understood that the teachings of the present disclosure are capable of use in various other combinations, modifications, and environments and is capable of changes or modifications within the scope of the teachings as expressed herein, commensurate with the skill and/or knowledge of a person having ordinary skill in the relevant art. The embodiments described are further intended to enable others skilled in the art to utilize the teachings of the present disclosure in such, or other, embodiments and with the various modifications required by the particular applications or uses. Accordingly, the processes, machines, manufactures, compositions of matter, and other teachings of the present disclosure are not intended to limit the exact embodiments and examples disclosed herein. Any section headings herein are provided only for consistency with the suggestions of 37 C.F.R. § 1.77 or otherwise to provide organizational cues. These headings shall not limit or characterize the invention(s) set forth herein.

DETAILED DESCRIPTION

An improved shock detection device, system, and methods for detecting stray currents have been developed and are described herein. The shock detection device, system, and methods are particularly advantageous for detecting dangerous electrical currents in freshwater, such as lakes, ponds, rivers, swimming pools, etc. But the teachings are not limited to such applications. Embodiments of the device, system, and methods may be advantageous wherever it is desired to detect the presence of electrical currents in a fluid medium. For instance, embodiments of the device, system, and method may be used in marine or other saltwater environments to detect stray currents that would otherwise cause corrosion. Likewise, embodiments may be used in industrial environments to detect corrosive or dangerous electrical currents or used by power companies to detect voltage leakage from power lines running underwater or underground near water.

A. Exemplary Embodiments of the Shock Detection Device

An exemplary embodiment of the shock detection device is shown in FIGS. 1-6. In this embodiment, the shock detection device comprises a pair of probes 5, a control unit 10 electrically connected to the pair of probes, and a power supply. The power supply may be both a battery 15 and a connection to mains electricity 17. The control unit 10 may include various components. As shown, the control unit 10 includes a housing 50 that is preferably waterproof and that contains a pre-processing circuit 20 electrically connected to the pair of probes, a processor 30 conductively coupled to the pre-processing circuit, and an LCD display 35 coupled to the processor. Additionally, a siren 40 and a strobe light 45 are integrated with the waterproof housing 50 of the control unit. The shock detection device is installed on, for instance, a dock 100, with the control unit 10 installed on dock piling and the probes 5 at least partially disposed in the water 105. Numerous variations of this embodiment are possible, which are further described below.

The probes 5 may be constructed from any suitable material. In an exemplary embodiment, the probes are aluminum, which advantageously is durable, cheap, and weather-resistant. Examples of other suitable materials include copper and gold, among other conductive materials. The probes may be any suitable shape, such as that show in FIGS. 3A-3C. The probes may also simply be an exposed wire. Although this disclosure sometimes refers to the probes as a pair of probes, it is to be understood that the device may include more than two probes, and in a preferred embodiment, contains at least three probes. Advantageously, in some embodiments with three or more probes, the probes are not spaced equidistantly to ensure that there is no "zero point," which would be a point where a source propagating from that location would generate signals that would travel the same distance to each of the probes and therefore would cancel each other out when detected by the probes. Additionally, in some embodiments the device may be configured to identify the direction of a stray current source. The device may therefore include at least three probes for detecting the two dimensional direction of the source, or at least four probes for detecting the three dimensional direction.

When the device is in operation, the probes are spaced apart from each other and at least partially disposed in the water or other fluid medium. In general, the greater the distance between the probes, the greater the distance at which the device will detect electrical sources. In some embodiments, the probes are spaced at least about 5 feet apart, more preferably at least about 8 feet apart, and even more preferably at least about 15 feet apart.

The pair of probes are electrically coupled to the control unit 10 and the processor 30 contained therein. In many embodiments, the control unit 10 comprises a waterproof housing 50, although a water-resistant or another type of housing may be used too. In a preferred embodiment, the waterproof housing is NEMA 4x housing, such as the NBR-32412 housing offered by BUD Industries. More preferably, the control unit may have a waterproof rating of at least IP67 or IP68. The housing is also preferably resistant to ultraviolet radiation. Many of the components of the control unit 10 are contained within and protected by this waterproof housing 50, while others are integrally secured on the housing.

The control unit 10 includes a processor 30 that is configured to detect and analyze the potential difference (voltage) between the two probes. Various components may be interspersed between the probes and the processor, and they comprise the detection circuit. For instance, as shown, the probes are coupled to one end of a conductive wire. The other end of the wire includes a waterproof connector that interfaces with a waterproof connector on the waterproof housing. The waterproof connector on the housing is in turn connected to a pre-processing circuit 20, which is connected to the processor.

In some embodiments, the detection circuit may not include a dedicated ground, and so the signals detected from the probes are not compared to a reference 0. This configuration may be advantageous because it isolates the device from noise and other interference that is associated with a ground reference, such as the ground on the dock's electrical system. In some of these embodiments, one of the probes may be connected to the ground of the detection circuit, or both of the probes may be connected to an analog-to-digital converter and the device has a floating ground. But in other embodiments, the detection circuit may have a dedicated ground, such as a connection to the ground on the dock's electrical system. This configuration may be advantageous for measuring the real value of the voltage in the water, such as when monitoring for non-alternating stray currents. In some embodiments where the dock includes conductive material, such as a metal frame, a probe may also be connected to the frame or other conductive material of the dock. The probe on the frame may be in addition to the ground connection (such as if the dock frame is not connected to ground) or an alternative to a ground connection. In configurations with a connection to ground or to the dock frame, the device may have a plurality of inductors, capacitors, or resistor to compensate for noise and other interference associated with the ground or dock frame. For instance, the device may include one or more banks of inductors or capacitors that the device may switch between to adjust the power factor of the circuit. Or additionally or alternatively, the device may include one or more banks of resistors that the device may switch between to adjust or match the impedance of the circuit. The device may further include various circuitry to monitor the power factor or impedance of the circuit and then accordingly adjust the banks of inductors/capacitors or banks of resistors.

The pre-processing circuit 20 may include various components that process the signals and protect the circuitry. In an exemplary embodiment, the signals are passed through a circuit protection chip, which reduces the input voltage from +/−120 V to +/−5 V. Any suitable circuit protection chip may be used, with the Maxim Integrates MAX366EPA+ circuit protector being exemplary. The signals are then converted from +/−5 V to 0-3.3 V and combined using a summing amplifier. Any suitable op amp may be used, such as Analog Devices' LT1006 chip. The pre-processing circuit may also include various fuses or voltage protection chips to further protect the circuit from damage due to high voltage and currents.

In some embodiments, the pre-processing circuit may also optionally or alternatively include a potentiometer, a low pass filter, a bandpass filter, or multiple of the foregoing components. The low pass filter or bandpass filter may be one that is readily available in a microchip, or it may be built from resistors, inductors, and capacitors. Advantageously, as one of skill in the art will recognize, these components may be employed to attenuate noise and higher frequencies before the signal is transmitted to the processor.

Ultimately, signals from the probes are transmitted to an analog-to-digital converter 25. In some embodiments, the analog-to-digital converter may be integral to a microcontroller containing the processor 30. The analog-to-digital converter may also be a component that is separate from the processor or microcontroller. In embodiments where one of the probes is connected to the ground of the detection circuit, the other probe is connected to the analog-to-digital converter 25. In other embodiments with a floating ground or a ground connection, each probe may be connected to its own analog-to-digital converter 25. Advantageously, this configuration may more accurately measure the voltage differential between the probes and may also eliminate some background noise. In some embodiments, additional analog-to-digital converters may be connected to one or both of either the device's ground connection or the device's neutral connection to the mains electricity. Additional analog-to-digital converter(s) allows the device to monitor those connections as well and more readily identify issues related to device's power supply and the noise associated with the supply.

The digital values are then transmitted to the processor 30 and may be stored in a buffer. The processor may be any suitable processor for performing the functions described herein. In many embodiments, the processor is part of a microcontroller that operates the device. The operation of the processor 30 is described in greater detail below.

The control unit 10, including the processor, is coupled to a power supply. In a preferred embodiment, the device is powered by an onboard battery 15 contained in the control unit. Preferably, this battery is rechargeable, and the battery may include cables 17 to connect to and receive a trickle charge from a main power supply, such as a typical 60 Hz 120 VAC outlet. In this embodiment, all components on the device are powered by a direct current from the battery, but the battery is not appreciably depleted absent an interruption in its alternating current power supply. Advantageously, this configuration constantly provides power to the device by mains electricity, but it also isolates the detection circuitry from any faults or other issues that might exist in the main power supply and otherwise affect the performance of the device. Additionally, the incorporation of a battery allows the device to continue to operate for a period of time notwithstanding an interruption in the main power supply.

Other embodiments, however, may incorporate different power supplies. For instance, in some embodiments, the device may be solely battery operated (rechargeable or not rechargeable). In other embodiments, the device may be solar powered, or a combination of solar powered and battery powered. Such an embodiment may be advantageous where the device is designed to monitor for stray currents from a buoy or vessel, where mains electricity is not readily available and constantly changing batteries would be time consuming or cost prohibitive. Alternatively, the device may be powered solely by mains electricity.

Figure 5:
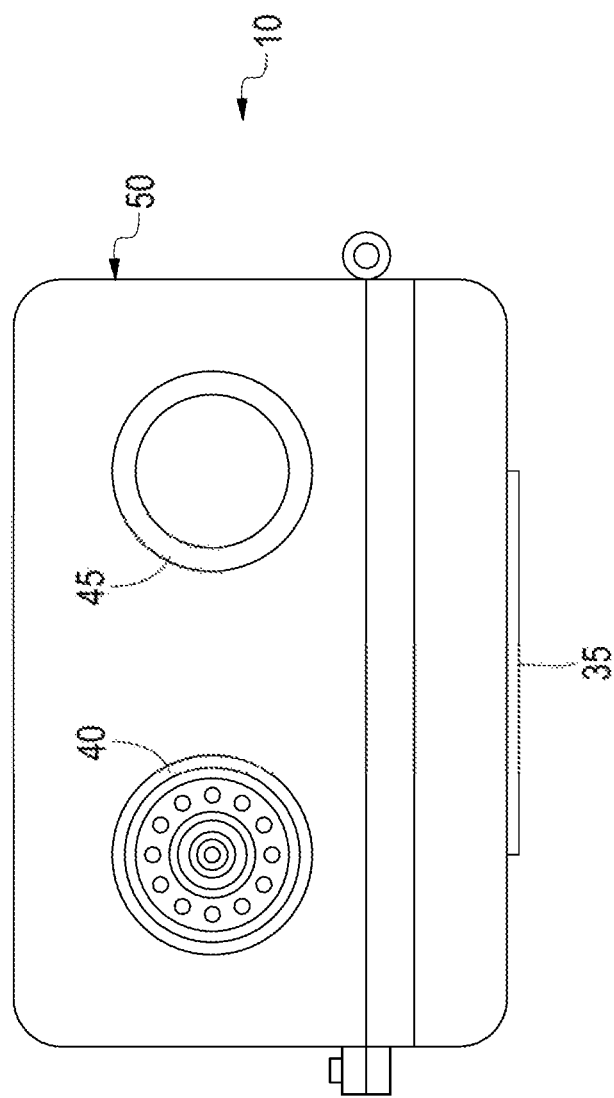
FIG. 5: A top view of the control unit of one embodiment of the shock detection device having a siren and LED strobe.
Figure 6A:
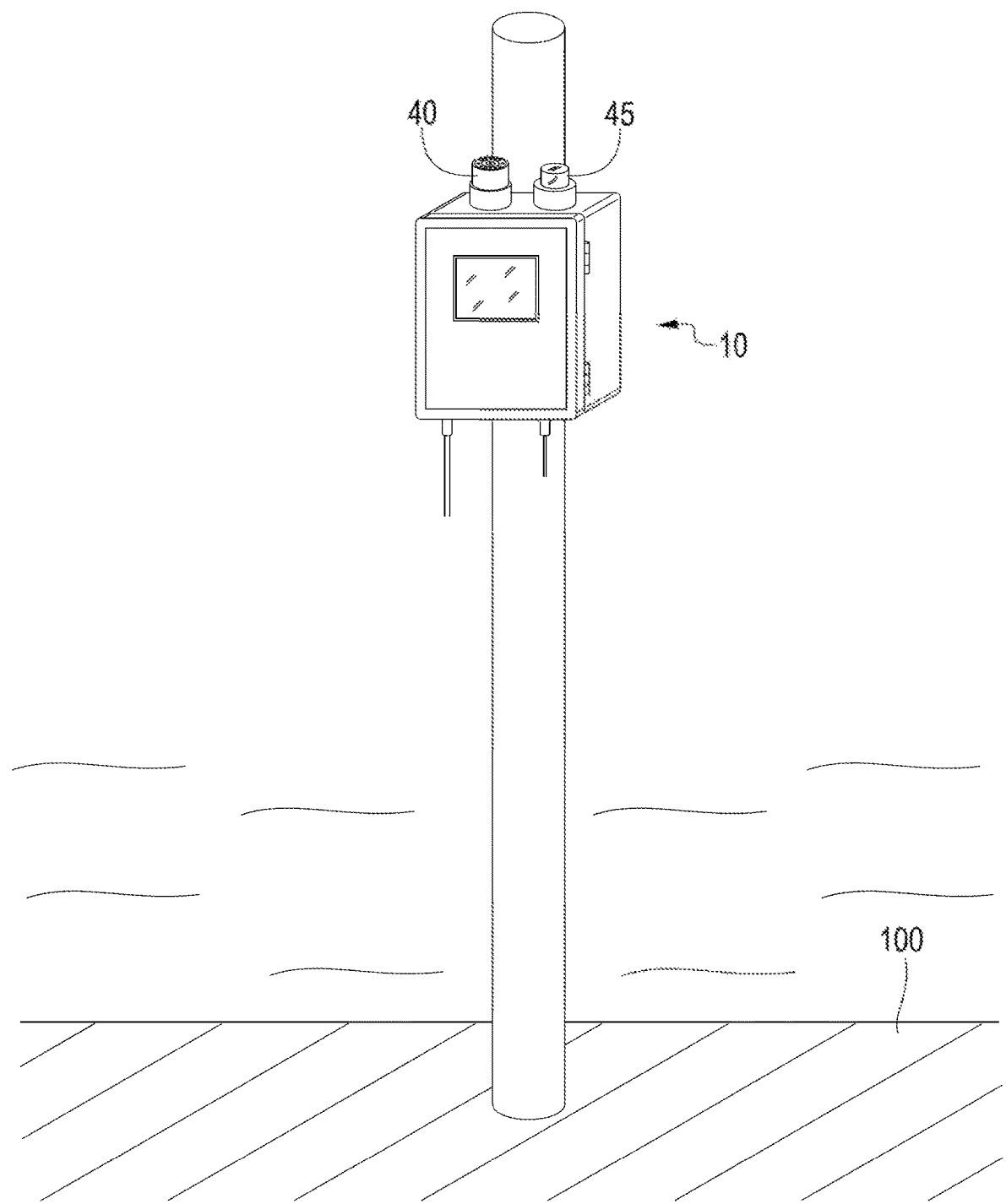
FIGS. 6A & 6B: Two perspective views showing a control unit and a probe, respectively, in one embodiment of the shock detection device installed on a dock.
Figure 6B:
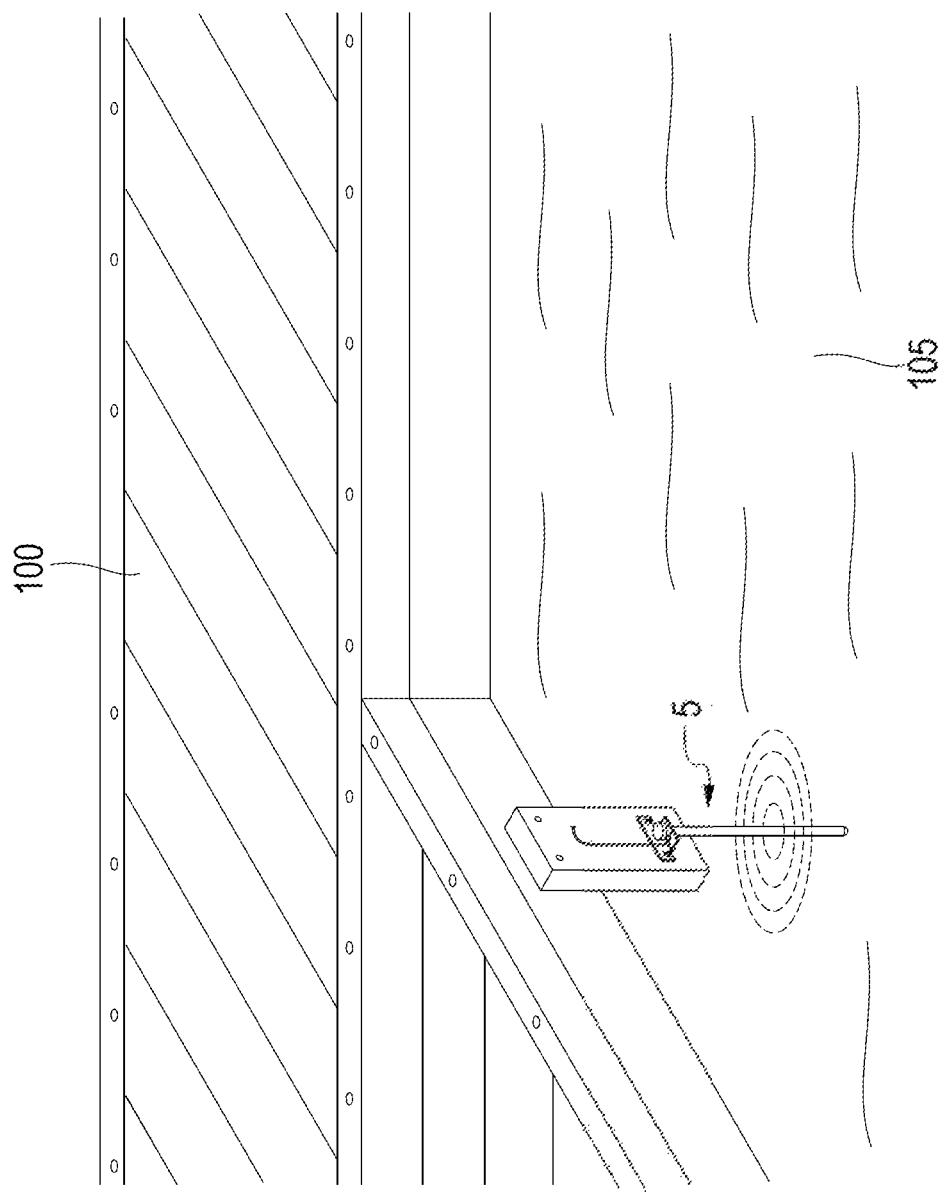

Ordinarily, the processor is also operably connected to various other components. As shown in FIG. 5, the device includes a LED strobe 45 and siren 40, which are both operatively coupled to the processor. When the processor detects a stray current, it may be configured to activate one or both of the LED strobe and siren. In some cases, the pattern of the strobe or siren may indicate information about the detected stray current, such as its intensity or type (e.g. 60 Hz versus non-60 Hz source).

Figure 7:
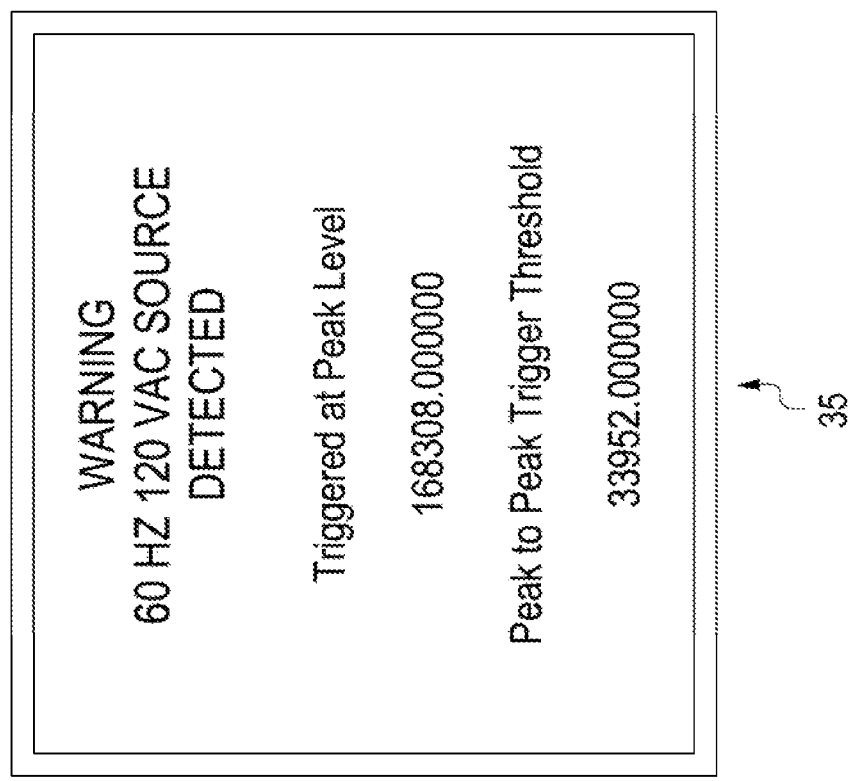
FIG. 7: A front view of the LCD display in one embodiment of the shock detection device showing a warning for a 60 Hz signal.

A display 35 may also be operably connected to the processor. In some embodiments, the display is an LCD display, and it may be a touch screen display, such as the Texas Instruments BOOSTXL-K350QVG-S1. The processor may be configured to provide various statuses or feedback via the display. For instance, as shown in FIG. 7, the display may provide information about a warning or other information when a specific frequency is detected. In some embodiments, such as those with a touch screen or other user interfaces, the display may also allow the user to input information or configure the device.

The processor may also optionally be coupled to one or more transceivers, such as a Wi-Fi transceiver, Bluetooth transceiver, or cellular transceiver. In such embodiments, the processor may be configured to utilize one or more of these transceivers to communicate with external devices or to transmit alarms or other messages to users or a remote server. For instance, when a dangerous signal is detected, the processor may use a transceiver to send a phone call, text message, email, or other message alerting users or other devices of the dangerous condition. The processor may also be configured to notify various entities, such as a power company or a lake operator. The transceiver may also facilitate communications with other devices in the surrounding area, thus potentially forming a type of mesh network. In such an embodiment, the communication may notify other devices in the area of the dangerous condition. The processor may also employ the transceivers for other purposes as well. For instance, data like usage data and ambient condition data may be collected and transmitted to a central server or to a cloud server. The server may perform further analysis and storage of such data, and the server may in turn communicate updates or other information back to the devices through their transceivers.

Optionally, the processor may also be operably connected to a memory 55, such as a non-volatile memory, to store data pertinent to its operation. In some embodiments, the memory may be an SD card or another type of flash memory.

In one preferred embodiment, the processor is also operably connected to a relay installed in the circuit of a known power source. For instance, where the device is installed on a dock with a main power supply, the relay may be installed on the circuit providing power to the outlets located on the dock. In the event that the device detects a stray current, the processor is configured to send a signal to the relay to disconnect its contacts and therefore open the circuit supplying power to the dock. Thus, to the extent that the known power source is causing the stray current, the device will immediately disable the source of the dangerous condition. Particularly where the device includes a battery power source, this configuration is advantageous because the device may disable any known power sources and continue to monitor for the presence of stray currents caused by unknown sources.

The control unit may also be operably connected to various other peripheral sensors and other devices. Some of these sensors may be relevant to and incorporated into the functions that monitor for the presence of stray currents. Examples of such sensors include water temperature, water conductivity, dissolved oxygen, water depth, and other sensors capable of sensing atmospheric or sensing medium conditions. Other sensors and devices may be less pertinent to monitoring for stray currents and instead monitor other factors or conditions. Examples include boat lift sensors, water level sensors, air temperature sensors, cameras, security system sensors, GPS sensors, and weather sensors. Any of the foregoing sensors may be connected to the control unit via a wired or wireless connection.

In some embodiments, the control unit 10 may support multiple pairs of probes or connect to a plurality of sub-control units. Each such sub-control unit may operate its own pairs of probes at its location. The connection between the main control unit and the sub-control units may be wired or wireless. These embodiments may be particularly advantageous for use in connection with commercial docks or marinas, where the detection distance of one pair of probes is insufficient to monitor the entire area of interest. In such an embodiment, the main control unit operates much like the control unit in other embodiments, except that the main control unit must process and analyze data associated with multiple sampling sites.

B. Operation of the Shock Detection Device

Advantageously, the shock detection device is configured to detect the presence of alternating currents by using frequency. These alternating currents are of particular concern because, as described above, they typically present the greatest risk of causing electric shock drowning. Alternating currents are typically characterized by a specific frequency associated with the alternating current. For instance, in most areas of the United States, mains electricity is provided at a 60 Hz frequency. The disclosure therefore focuses on 60 Hz frequency, but the teachings could be applied to monitor for any other frequency. The shock detection system therefore monitors for a specific frequency to detect the most dangerous types of currents with greater reliability and at greater distances.

Figure 8:
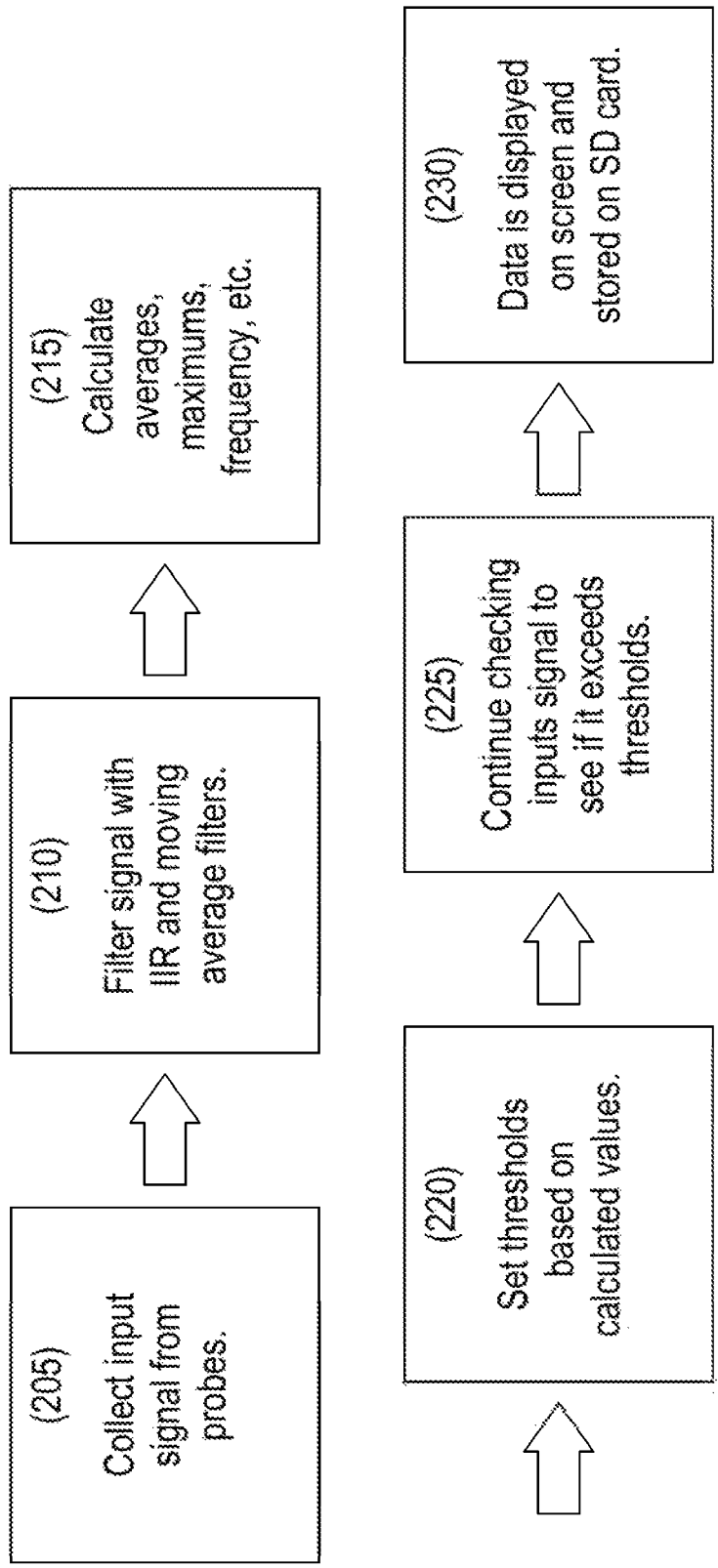
FIG. 8: A flow chart showing the operation of one embodiment of the shock detection device.

FIG. 8 provides a flow chart summarizing one exemplary operation of an embodiment of the shock detection system, with numerous variations and alternatives being described in greater detail below. At step 205, the device collects input signals from the probes. At optional step 210, the device applies optional filtering and trimming functions to the collected data. Non-limiting examples include an IIR filter and a moving average filter. At step 215, the device calculates various characteristics associated with the signal, such as the average voltage, maximum voltage, and peak(s) in voltage, as well as various indicators of the presence of a frequency in the signal. This step may also include determining whether a frequency is present in the signal. At optional step 220, the device may set one or more thresholds based on the calculated values. For instance, where the previously collected data is associated with an initialization or self-calibration function, the device may set thresholds based on the then-current noise that is detected in the environment. At step 225, the device continues collecting input signals from the probes (205), applying filters and trimming to the data (210), and calculating characteristics associated with the signal (215). This step may further include a step at which the device determines whether the collected data is associated with a frequency. At step 230, the device may display data or other information on its display screen and store data in its internal memory. A message may be continuously displayed, or only selectively displayed when certain conditions are detected. At this step, the device may also trigger one or more alarms, such as an audible or visual alarm.

The following disclosure describes various features that some embodiments may employ in the detection of stray alternating currents. These features include detection of a specific frequency (or frequencies), calibration functions, and functions for determining detection distance. Embodiments may also include features to detect other potentially dangerous stray currents, such as dangerous direct currents or dangerous alternating currents (of different frequencies). Embodiments of the device may have some, but not necessarily all, of the following features.

1. Detection of Stray Alternating Current Using Frequency

Figure 9A:
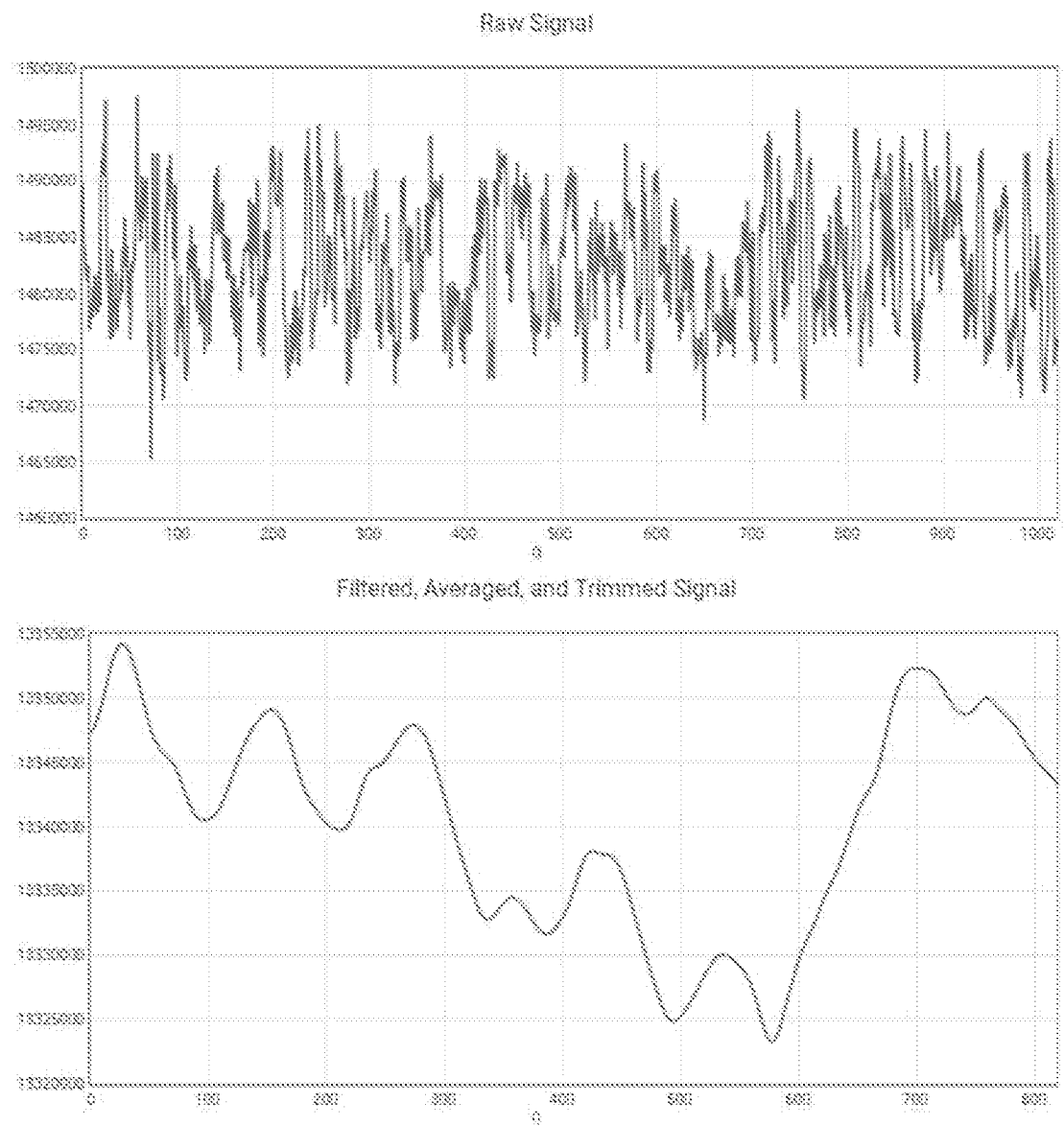
FIG. 9A: Graphical depictions of a raw sample set and a filtered and trimmed sample set of data collected by an embodiment of the shock detection system in the presence of only noise.
Figure 9B:
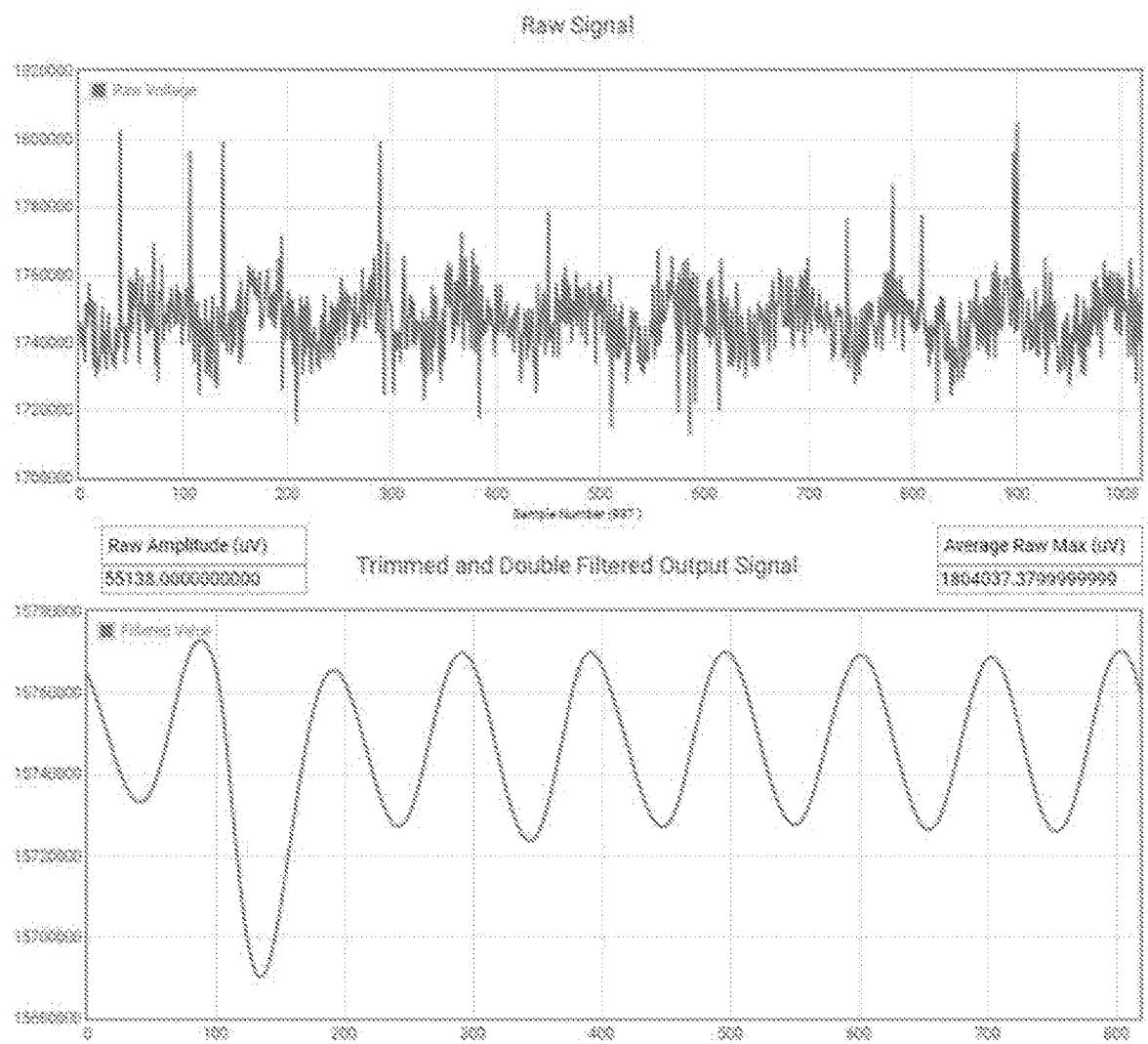
FIG. 9B: Graphical depictions of a raw sample set and a filtered and trimmed sample set of data collected by an embodiment of the shock detection system in the presence of a 60 Hz 120 VAC source.

In an exemplary embodiment, the device monitors for stray alternating currents as follows. The pair of probes 5 gather signals from the water. Those signals are transmitted to an analog-to-digital converter, where the signals are converted into digital readings and stored as a series of samples in a buffer. Once the buffer has stored a sufficient number of samples, the software on the processor processes the samples to determine whether the samples indicate the presence of a specific frequency. The upper graphs shown in FIGS. 9A and 9B provide graphical depictions of exemplary samples that may be collected, with microvolts shown on the vertical axis and the sample number shown on the horizontal axis. The lower graphs depict the same data for analysis after various filters and trimming have been applied. If a specific frequency is detected in the samples, an appropriate alarm is thereby triggered.

The identification of a specific frequency may be accomplished by various techniques. An exemplary technique uses peak voltage detection to determine whether the number and timing of peaks in the sample set is indicative of a specific frequency. As a first step, the peak voltages in the samples are identified. In an exemplary embodiment, the peaks are identified after applying a moving average buffer to the samples, which eliminates or smooths out noise in the samples. Various values may then be calculated from the moving averages, including amplitude, maximum voltage, minimum voltage, mean voltage, number of peaks, and number of troughs. Of course, other known smoothing techniques may be used instead, or in some instances, no smoothing may be applied.

The timing and number of peaks can then be compared to the timing and number that would be characteristic of a known specific frequency, such as 60 Hz. For instance, if the set of samples covers a period of approximately 1/6 of a second, a 60 Hz signal would have approximately 10 peaks in the sample period. Assuming that the device takes approximately 1020 samples within that 1/6 of a second, the peaks would be spaced apart by approximately 102 samples. Using this information, the processor can use a histogram function to determine how many of the peaks in the sample coincide with the timing of a peak in a 60 Hz signal (or any other frequency of interest). If at least a threshold number of peaks in the sample coincide with the timing of peaks in a 60 Hz signal, the processor would note the presence of a 60 Hz signal. To account for noise and other conditions that may cause some peaks in the sample to be misaligned with the timing of a 60 Hz signal (without noise), this threshold may be set as a fraction of the number of peaks that would be expected in a pure 60 Hz signal. An appropriate fraction should be selected to balance between the risk of false alarms and risk of false non-detections. The higher the fraction, the more likely that the device will not detect a 60 Hz signal, but the lower the fraction, the more likely that the device will trigger false alarms. In some preferred embodiments, the threshold number of peaks is calculated using a fraction of about 2/5 (0.4) or about 7/20 (0.35).

Other frequency-dependent characteristics may be used to determine whether the samples exhibit a pattern that is characteristic of specific frequency. For instance, zero crossing detection may be used. Or some embodiments may use slope detection, which may calculate the slope between peaks and troughs, between peaks to zero points, or between zero points to troughs. Multiple techniques may be combined together too. For instance, some embodiments might employ both zero crossing detection and slope detection to identify frequency. A fourier transform or a fast fourier transform may also be used instead of or in addition to the foregoing methods to determine whether frequency is present and the strength of the frequency.

Because noise may sometimes exhibit a pattern that is similar to a specific frequency, the device may optionally perform additional analysis to confirm that a detected frequency is associated with a potentially dangerous source rather than noise. In one embodiment, the device compares the amplitude of the potentially dangerous signal to a preset threshold. This preset threshold may be set programmatically or set during initialization and periodic self-calibrations of the device. In the latter instance, the device may be configured to periodically calculate the amplitude associated with the noise in its operating environment. The preset threshold may then be calculated by multiplying the amplitude of the background noise by a set multiple. Like with the fraction used to set the threshold for peak detection, the multiple must be selected to balance the risk of false alarms with the risk of false non-detections. In a preferred embodiment, the multiple is approximately 2 or approximately 1.13. Thus, if the amplitude of the potentially dangerous signal exceeds the preset threshold (e.g. using a multiple of 2, if the amplitude is at least twice the amplitude of ordinary noise), it corroborates that the potentially dangerous signal was generated by a dangerous electrical current.

Of course, as one of skill in the art will recognize, other methods may be used to confirm that a detected frequency is in fact associated with a dangerous electrical current instead of background noise. For example, in some embodiments, the device may calculate the average voltage of the set of samples and compare it to the average voltage of known background noise. A dangerous electrical current would tend to be confirmed if the average voltage of the samples is sufficiently greater than the average voltage of background noise. Optionally, any of the foregoing analyses may be performed before analyzing the samples for the presence of a specific frequency. That is, the device may be configured so that it first determines if the amplitude of the signals exceeds the preset threshold, and only if so, the device further analyzes the signal to detect the presence of a specific frequency.

The detection of a frequency is not necessarily limited to monitoring for the presence of only a single frequency in the sample. In some embodiments, the device may be configured to monitor for the presence of two or more specific frequencies. For instance, one embodiment may monitor for both a 50 and a 60 Hz signal. In such an embodiment, the primary difference would be that the analysis would include determining whether the detected signal sufficiently matched either a 60 Hz or a 50 Hz signal.

Optionally, before analyzing for the presence of a frequency, the device may also be configured to perform various filtering and trimming functions on the set of samples. These filtering and trimming functions are helpful so that the raw signal, which is impacted by noise and other factors, is smoothed before further analysis. Thus, any suitable filtering and trimming functions may be used.

In one preferred embodiment, the processor first applies a second order biquad cascade infinite impulse response (IIR) filter to the set of samples. The following set of coefficients are exemplary of the coefficients that may be used in connection with this filter: 0.0017880687547207942; 0.0035761375094415884; 0.0017880687547207942; 1.8427059735989995; −0.08498582486178826; 0.0018703168777286815; 0.003740633755457363; 0.0018703168777286815; 1.927467315792245; −0.9349485833031597. After the filter is applied, the first n samples may be trimmed from the set because the filter's initial response will dominate the first approximately n values. In an exemplary embodiment where the set consists of approximately 1020 samples, the first approximately 200 samples are trimmed from the filtered set.

Thereafter, a moving average filter may be applied to the filtered and trimmed set. The moving average filter is based on a first-in, first-out principle. In a preferred embodiment, the moving average filter calculates the moving average based on 10 samples. This filter helps to eliminate additional noise from the data and stabilizes the values for further analysis for the presence of a frequency.

FIGS. 9A and 9B are exemplary of how the raw data may be processed using the above filtering and trimming functions. In each figure, the upper graph represents the raw detected signal. The data shown in FIG. 9A is characteristic of a set of raw samples collected where only random noise is present. The data shown in FIG. 9B is characteristic of a set of raw samples collected where a 60 Hz signal is present. Although an overall pattern is noticeable in the graphical depiction of this set of raw samples, the random noise obscures the overall pattern. The lower graphs, however, depict the same sample sets after filtering and trimming have been applied. As shown in FIG. 9A, the random noise results in a filtered and trimmed sample set that exhibits mostly random characteristics. In FIG. 9B, on the other hand, the filtered and trimmed sample set exhibits a sinusoidal pattern that is characteristic of an alternating current. Both of these smoothed and trimmed sample sets may then be more easily analyzed for the presence of a specific frequency, as described above.

Non-limiting examples of other filtering and averaging techniques that might be used include: another type of IIR filter, such as a fourth order lowpass IIR filter or any other IIR filter of $n^{th}$ degree; a fast fourier transform; an FIR filter; or another moving average filter, such as a filter based on the average of anywhere between 5 and 100 samples. Any of the foregoing filters, including IIR and FIR, may also be used in combination with a high pass, low pass, band pass, band stop, notch, all pass, or comb filter, or a combination of those filters.

Where an embodiment includes three or more probes, the foregoing techniques may be applied to measure the potential difference between each set of two probes. Each of the probes may have its own dedicated analog-to-digital converter. Advantageously, performing the detection between multiple sets of probes increases the likelihood that a stray current will be detected and may also allow for determining the direction of the source of the stray current.

In some embodiments, the shock detection device may also include features to monitor for the presence of more than one stray current or to account for the presence of a current that (even if not dangerous) is increasing noise in the ambient environment. For instance, sometimes the ground of the dock's electrical system or the dock frame may have a voltage that will induce a voltage in the water. In embodiments that include a probe connected to the ground on the dock's electrical system or to the dock frame, the device may be configured to monitor for the presence of a voltage specifically associated with the ground or the dock frame. Any combination of the techniques discussed in this disclosure may be used to monitor for the presence of this voltage, including the various filtering, trimming, calibrating, analyzing, and comparing techniques disclosed herein. If the device detects the presence of a stray current associated with the ground or the dock frame, the device may be programmed to trigger an alarm. The alarm may also include a characteristic that specifically identifies that the dangerous condition as being associated with the ground or dock frame.

Using the data that the device collects associated with the probe connected to the ground or dock frame, the device may be configured to apply various filtering or special analysis to the data collected from the probes disposed in the water to account for any voltage induced in the water by a voltage on the ground or dock frame. This filtering or analysis may be applied even if the voltage detected on the ground or dock frame does not exceed the levels required for triggering an alarm.

In one exemplary embodiment, the device is configured to compare the data collected from a probe disposed in the water to the data collected from a probe on the ground or dock frame to determine if the ground or dock frame is inducing a voltage in the water. For instance, in some embodiments it is expected that the voltage on the ground must exceed at least 1 volt, and sometimes at least 2 volts, to induce a voltage in the water. This threshold may vary based on the installation environment. If a voltage is detected on the ground that exceeds the relevant threshold, the device may then analyze the signals associated with the water to determine whether a voltage is being detected in the water. In some embodiments, it is expected that a voltage in the water of at least 200 mV will be detected if the ground is inducing a voltage, although again this threshold may vary based on the installation environment. Thus, if the voltage in the water exceeds this threshold, the device may be programmed to indicate that the ground is inducing a voltage in the water. Once such a condition is detected, the device may alert a user and, optionally, ask whether to ignore this condition as a false alarm. However, in the event that the voltage in the water exceeds a certain higher threshold that is associated with a dangerous condition, such as 1.2 V in the water, the device may be programmed to transmit an alarm regardless of whether the ground is inducing the voltage.

In another exemplary embodiment, the device is configured to adjust a threshold or to adjust the data collected from a probe disposed in the water based on the data collected from a probe on the ground or dock frame. This adjustment may be dependent on the determination of whether the ground or dock frame is inducing a current, or it may be applied independent of any such analysis. By adjusting the thresholds or the data associated with the water, the device removes or lessens noise caused by the ground or dock frame and thereby increases the likelihood of detecting a dangerous stay current from another source. For example, in some embodiments, the device may update its thresholds once it is determined that a voltage on the ground or dock is inducing a voltage in the water. For instance, in an embodiment where (as discussed below) the device is programmed to detect a dangerous condition whenever the absolute voltage in the water exceeds a threshold, for instance 1 V, the device may update its absolute voltage threshold. Thus, if the voltage in the water was 600 mV and determined to be induced by the ground, the device may then update its absolute voltage threshold to be 1.6 V. By updating this threshold, the device is able to detect the presence of a new condition that may indicate a dangerous stray current while reducing the likelihood of triggering a false alarm.

As another example, in some situations the voltage induced by the ground or dock frame that is measured at the probe in the water may be completely or mostly out of phase with the voltage of another source of stray current that is measured at the probe. As a result, the net effect at the location of the probe may be that the respective voltages cancel each other out, or at least sufficiently reduce the voltage below a certain threshold, such that no dangerous condition is detected. However, by adjusting the data collected from the water based on the data collected from the ground or dock frame, this net effect can be advantageously cancelled out so that a dangerous source of stray current is detected. Thus, in situations where the device also detects a dangerous condition associated with the ground or dock frame, the device may actually detect the presence of two dangerous sources. The detection of two dangerous conditions may trigger a special alarm that indicates the presence of multiple dangerous conditions.

2. Calibration of the Shock Detection Device

As mentioned above, the shock detection device may include various automated calibration features. Exemplary calibration features include an initialization sequence and periodic self-calibrations.

In some embodiments, the shock detection device may be configured to perform an initialization sequence when the device is powered on. Among other functions, the initialization sequence may allow the device to determine the amplitude of background noise, which is used to set the preset threshold that determines whether a detected 60 Hz frequency is associated with noise or a dangerous source. In an exemplary embodiment, this part of the initialization sequence includes collecting one or more sets of samples, analyzing those sets of samples to confirm the non-existence of a 60 Hz frequency, calculating the amplitude of the samples, and determining the preset threshold by multiplying the calculated amplitude by a preset multiple. Further, in embodiments that include features that notify users about the device's maximum detection distance (discussed below), the initialization sequence may also include calculating the initial maximum detection distance.

The initialization sequence may also include various other functions too. Some embodiments include a probe check sequence, which may detect various conditions like whether the probes have become fouled, have been damaged, or are out of the water. If the probes do not pass the check, the user may be alerted of the fault via audible, visual, or textual notifications. Likewise, the device may also perform various checks to confirm that its detection circuit, including the preprocessing circuit, are fully functional.

In addition to or in lieu of the initialization sequence, the device may be configured to perform periodic self-calibrations. For instance, in some embodiments, the device may be configured to perform self-calibrations after a set number of cycles or sample sets (such as every 100,000 cycles) or after a set period of time (such as 24 hours).

Much like the initialization sequence, the periodic self-calibrations may include functions that reset or recalibrate the device's thresholds or other parameters. For example, the self-calibration may include collecting a new set or sets of samples, ensuring that the samples do not contain a 60 Hz frequency, and calculating a new preset threshold based on the amplitude of the noise in the new sample sets. Likewise, the self-calibration may include recalculating the conductivity of the water and updating the device's maximum detection distance (discussed below). Advantageously, because factors such as the noise or conductivity in an environment can change suddenly or gradually over time, these periodic self-calibration functions ensure that the device uses settings that are appropriate for its current operating environment.

In some embodiments, the shock detection device may also include calibration features for background 60 Hz noise. For instance, where a device is installed proximate to a power plant, the environment may contain a certain base level of 60 Hz noise from that source. The device may therefore include a feature whereby, when 60 Hz noise is detected and determined to be non-dangerous, the device updates its parameters to filter out or ignore the 60 Hz noise associated with the non-dangerous source.

3. Calculating Detection Distance or Determining Probe Fouling

In some embodiments, the device may also be configured to notify users about its maximum detection distance. For instance, the detection distance may be shown on the LCD display. With this information, users have an understanding of the size of area being monitored by the device.

As mentioned above, the distance at which a signal may be detectable can vary significantly depending on the conductivity of the water in a specific operating environment. In general, the greater the conductivity of the water, the greater distance at which the signal may be detected. The conductivity of a specific operating environment, however, is ordinarily not known in advance. And even if the current conductivity is known, it can change over time as conditions—particularly the mineral content of the water—change. Additionally, the background level of noise can affect the detection distance. A distant signal is more likely to be detected in a less noisy environment than in a noisier environment (as measured by the amplitude of random noise). That is because, as the amplitude of a distant signal becomes closer to or less than the amplitude of random noise (that is, the signal-to-noise ratio decreases), it becomes more difficult to differentiate the signal from the surrounding noise.

A preferred embodiment therefore includes a feature that calculates the conductivity of the water, from which the maximum detection distance may be derived. To calculate the conductivity, the distance between the pair of probes must be known. In some embodiments, the pair of probes are integrated into a structure that spaces the probes at a known distance, or in other embodiments users are instructed to place the probes at a specific distance (e.g. 8 feet apart). In yet other embodiments, users may be instructed to install the probes in a range of distances (e.g. between 5 and 15 feet) and prompted to input the selected distance into the control unit. As another alternative, a user may dip another wire into the water at a known distance.

Once the distance between the probes is known, the processor may be configured to transmit a signal to one of the probes. In some embodiments, that signal is at a low voltage and a higher frequency than a 60 Hz voltage source. That signal is in turn received by the second probe and transmitted back to the processor. Based on the attenuation of the received signal, the processor may calculate the conductivity (or the converse property, resistivity) of the water.

The maximum detection distance may be derived from this calculated conductivity and, optionally, from the amplitude of background noise. In some embodiments, the calculated conductivity is compared to a reference table that contains a data set of known conductivities and the associated maximum detection distance for each conductivity. This data set may be obtained from empirical testing and stored in memory of the control unit. From this table, the maximum detection distance may be selected based on the known conductivity that is closest to, or that is no greater than, the calculated conductivity. The selection of a maximum detection distance may also be refined based on the amplitude of noise detected during the initialization or self-configuration functions discussed above. Thus, the reference table may contain a list of maximum detection distances that are associated with both a known conductivity and a known amplitude of background noise.

Alternatively, in some embodiments, the maximum detection distance may be derived from an equation that includes inputs for the calculated conductivity and the sensitivity of the components in the device. The detected amplitude of background noise may also be an input into such an equation.

Advantageously, the maximum detection distance may be periodically updated. For instance, in some embodiments, the maximum detection distance may be calculated during the initialization procedure discussed above and also periodically updated when the device self-calibrates. In such embodiments, the control unit may also be configured to notify users if the maximum detection distance changes significantly during operation of the device.

The foregoing technique may also be performed and tracked over time to detect the presence of probe fouling. If a probe becomes fouled (such as through algae growth or oxidation), its sensitivity may be decreased. Thus, if the sensing range is detected and recorded when the system is installed, the sensing range may then be tracked over time to determine whether the sensing range has degraded, and if so, whether that degradation is associated with decreased conductivity in the water (which varies over time) or probe fouling. If the device determines that the probes may be fouled, the device may be configured to transmit an alarm to check the probes.

4. Detection of Other Stray Currents

Although particular alternating currents (e.g. 60 Hz) often present the most common danger, other stray currents may also present a danger. These other dangerous currents include alternating currents of a different frequency (e.g. not 60 Hz) and direct currents. The shock detection device may be configured to monitor for and alert of the presence of such other currents.

In an exemplary embodiment, the device monitors for the presence of these other currents by monitoring for the presence of a dangerous voltage. Such a dangerous voltage may be identified by comparing a measured voltage to a threshold voltage. In some embodiments, the measured voltage is calculated from the raw sample set (i.e. before any filtering and trimming) or after certain filtering and trimming has been applied. In either case, the processor may calculate the max voltage, mean voltage, absolute voltage, amplitude, or other values, or a combination of the foregoing values, from the sample set. The calculated value or values are compared to a threshold or set of thresholds associated with a dangerous voltage. In many cases, the thresholds are programmatically set. For example, in embodiments where the device monitors for dangerous voltages using the detected absolute voltage, the threshold may be set to 1 V, or to 0.5 V. Where a signal is detected exceeding the set threshold, the user may be notified of the presence of a dangerous stray current. The notification may further include information indicating that the dangerous current is different from the frequency being monitored for (e.g. that the detected stray current is a non-60 Hz signal).

C. Performance of the Shock Detection Device

Various testing has been performed to confirm the performance of the shock detection device. This testing has generally confirmed that embodiments of the shock detection device can reliably detect 60 Hz stray currents at significant distances. The testing has also confirmed that the shock detection system can detect such currents at greater distances than existing devices that rely upon voltages or voltage gradients. This testing has also confirmed that the device is capable of detecting other dangerous, non-60 Hz stray currents.

In one series of tests, the performance of the device was compared to an existing commercially available device. This existing device is battery operated and works by detecting a voltage gradient in the water. It is portable and self-contained; its probes are located on the bottom of the unit and the entire device is placed in a body of water. The device triggers an audible and visual alarm if the gradient exceeds a certain threshold, with the sequence of the audible alarm indicating the intensity of the voltage gradient.

Three different tests were performed to compare the detection range of the commercially available system to an embodiment of the shock detection device. For purposes of these tests, the embodiment of the shock detection device was configured so that the pair of probes were spaced 15 feet apart. In each test, the respective device was placed in the water and a 60 Hz 120 VAC signal was introduced into the water at successively increasing distances. The first two tests were performed in a freshwater pond, and the third test was performed in a saltwater pool. The results of these tests are summarized in Table 1 below, with black cells indicating the failed detections.

TABLE 1

Testing Comparisons of Commercially Available System and an Embodiment of the Shock Detection System

| | Distance of Probe from Source (ft) | Commercially Available Shock Detection System | Embodiment of the Shock Detection Device |
|---|---|---|---|
| Test 1: Freshwater Pond | No Source | No | No |
| | 5 | 3 Beeps (91 mV/ft) | Yes |
| | 10 | 1 Beep (20 mV/ft) | Yes |
| | 15 | 1 Beep (20 mV/ft) | Not tested |
| | 25 | No | Yes |
| | 50 | No | Yes |
| Test 2: Freshwater Pond | No Source | No | No |
| | <5 | 4 Beeps (200 mV/ft) | Yes |
| | 5 | 2 Beeps (42 mV/ft) | Yes |
| | 10 | 1 Beep (20 mV/ft) | Yes |
| | 15 | 1 Beep (20 mV/ft) | Not Tested |
| | 25 | No | Yes |
| | 50 | No | Yes |
| Test 3: Saltwater Pool | No Source | No | No |
| | <5 | 4 Beeps (200 mV/ft) | Not Tested* |
| | 5 | 4 Beeps (200 mV/ft) | Not Tested* |
| | 10 | 4 Beeps (200 mV/ft) | Not Tested* |
| | 15 | 2 Beeps (42 mV/ft) | Not Tested* |
| | 20 | 1 Beep (20 mV/ft) | Not Tested* |
| | 25 | No | Not Tested* |
| | 40 | No | Yes |

As shown in Table 1, the embodiment of the shock detection device consistently detected the presence of a 60 Hz signal at distances greater than the commercially available system. In the freshwater pond environment, the maximum detection range of the commercially available system was about 15 feet from the source. The shock detection device, however, detected the presence of this same source at a distance of approximately 50 feet from its nearest probe. In the saltwater pool, which has much greater conductivity than freshwater, the maximum detection range of the commercially available system was about 20 feet from the source. Although comparable tests of the embodiment of the shock detection device were not performed at close distances to avoid damaging the unit, the device was able to detect this same source at a distance of 40 feet from its nearest probe.

This improved performance is due to the fact that the device uses frequency, rather than voltage, voltage gradient, or current, to detect a 60 Hz signal. Unlike voltage and current that attenuate over a distance, the frequency of the signal does not attenuate. In other words, as distance from a source increases, the voltage or current measured from the source will decrease, which makes it more difficult to distinguish the voltage or current of the source from the voltage or current of mere background noise. But at these greater distances, a specific frequency is more readily distinguishable from random noise because the frequency maintains its characteristic pattern.

Subsequent testing of embodiments of the shock detection device has confirmed the significant detection range of the device. For instance, one embodiment of the shock detection system has shown the ability to detect the presence of a 60 Hz 120 VAC signal in a certain low-noise freshwater pond at approximately 100 feet from the source. In those tests, the device was configured with its probes approximately 15 feet apart and used both frequency analysis and amplitude analysis to confirm the existence of a 60 Hz source. Even at that range, the amplitude of the detected signal was more than twice the amplitude of the background noise. And the device was able to confirm that the detected signal included a sufficient number of peaks that coincided with the timing of a 60 Hz frequency.

As another example, a different embodiment was tested in which the probes were spaced approximately 8 feet apart. In this embodiment, the device was able to detect the presence of a 60 Hz 120 VAC signal in the same freshwater pond at approximately 50 feet from the source. Again, the amplitude of the detected signal was more than twice the amplitude of the background noise, and the device was able to confirm the existence of a 60 Hz frequency in the detected sample.

While the invention has been described with respect to a limited number of embodiments, those skilled in the art, having benefit of this disclosure, will appreciate that other embodiments can be devised which do not depart from the scope of the invention as disclosed here.

We claim:

1. A shock detection device comprising:
a plurality of probes for at least partially disposing in a fluid medium; and
a control unit comprising:
at least one analog-to-digital signal converter in electrical communication with at least one of said plurality of probes;
at least one audio-visual alarm; and
a processor operably coupled to said at least one converter and to said at least one audio-visual alarm,
wherein said processor is operable to measure an electrical potential difference between two of said plurality of probes, to calculate at least one frequency-dependent characteristic associated with a plurality of said measurements, and to transmit an alert signal to said at least one audio-visual alarm in response to an alarm condition, wherein said alarm condition includes that said at least one frequency-dependent characteristic satisfies a threshold.

2. The device of claim 1, wherein said threshold is based on a known frequency-dependent characteristic of a predetermined frequency.

3. The device of claim 1, wherein said at least one frequency-dependent characteristic is the number of peak amplitudes, the timing of peak amplitudes, the number of trough amplitudes, the timing of trough amplitudes, the number of zero crossings, the timing of zero crossings, or the slope of a portion of said plurality of measurements.

4. The device of claim 1, wherein said processor is operable to calculate a voltage value associated with said plurality of measurements, wherein said alarm condition includes that said voltage value exceeds a voltage threshold.

5. The device of claim 4, wherein said voltage value is a maximum voltage, a mean voltage, or an absolute voltage of said plurality of measurements.

6. The device of claim 1 further comprising at least three probes, wherein said processor is operable to measure an electrical potential difference between each pair of said three probes.

7. The device of claim 1, wherein said control unit comprises a second analog-to-digital signal converter in electrical communication with another of said plurality of probes.

8. The device of claim 1, further comprising:
a dock probe for disposing on a dock,
wherein said processor is operable to measure an electrical potential difference associated with said dock, to analyze said plurality of measurements associated with said dock to detect the presence of a voltage associated with said dock, to analyze said plurality of measurements associated with a fluid medium to determine whether said voltage associated with said dock is inducing a voltage in said fluid medium, and to transmit an induced-voltage signal to said at least one audio-visual alarm upon detecting the presence of an induced voltage.

9. A shock detection device comprising:
a plurality of probes for at least partially disposing in a fluid medium; and
a control unit comprising:
at least one analog-to-digital signal converter in electrical communication with at least one of said plurality of probes;
at least one audio-visual alarm; and
a processor operably coupled to said at least one converter and to said at least one audio-visual alarm,
wherein said processor is operable to measure an electrical potential difference between two of said plurality of probes, to apply at least one filter that reduces the amount of noise in a plurality of said measurements, to analyze said plurality of filtered measurements to detect the presence of a predetermined frequency, and to transmit an alert signal to said at least one audio-visual alarm upon detecting said predetermined frequency.

10. The device of claim 9 wherein said at least one audio-visual alarm is selected from the group consisting of a siren, a speaker, a light, and a display.

11. The device of claim 9, wherein said predetermined frequency is selected from the group consisting of 50 Hz and 60 Hz.

12. The device of claim 9, wherein said control unit comprises a battery powering said processor and said battery is connected to mains electricity.

13. The device of claim 9 further comprising at least three probes, wherein said processor is operable to measure an electrical potential difference between each pair of said three probes.

14. The device of claim 9, wherein said control unit comprises a second analog-to-digital signal converter in electrical communication with another of said plurality of probes.

15. The device of claim 9, wherein said processor is connected to a ground reference, and wherein said processor is operable to measure an electrical potential difference between said ground reference and one of said plurality of probes, and to transmit a voltage alert signal to said at least one audio-visual alarm if said electrical potential difference exceeds a predetermined threshold.

16. The device of claim 9, further comprising:
a transceiver operably coupled to said processor,
wherein said transceiver is operable to transmit a message upon detecting said predetermined frequency.

17. The device of claim 9, wherein said processor is operable to analyze said plurality of measurements by calculating at least one frequency-dependent characteristic of said plurality of measurements and comparing the at least one calculated frequency-dependent characteristic to at least one known frequency-dependent characteristic associated with said predetermined frequency.

18. The device of claim 9, wherein said processor is operable to transmit a signal from one of said plurality of probes to another of said plurality of probes, to calculate the conductivity of said fluid medium based on the attenuation of the signal received by said another probe, and to determine a maximum detection distance based on said conductivity.

19. A shock detection device comprising:
a plurality of probes for at least partially disposing in a fluid medium; and
a control unit comprising:
at least one analog-to-digital signal converter in electrical communication with at least one of said plurality of probes;
at least one audio-visual alarm; and
a processor operably coupled to said at least one converter and to said at least one audio-visual alarm,
wherein said processor is operable to collect a plurality of initialization measurements by repeatedly measuring the electrical potential difference between two of said plurality of probes, to calculate an initialization voltage value of said plurality of initialization measurements, to determine an alarm threshold voltage based on said initialization voltage value, to collect a plurality of monitoring measurements by repeatedly measuring the electrical potential difference between two of said plurality of probes, to calculate a monitoring voltage value of said plurality of monitoring measurements, and to transmit an alert signal to said at least one audio-visual alarm in response to an alarm condition, wherein said alarm condition includes that said monitoring voltage value exceeds said alarm threshold voltage.

20. The device of claim 19, wherein said initialization voltage value is a maximum voltage, a mean voltage, or an absolute voltage of said plurality of initialization measurements.

21. The device of claim 19, wherein said processor is operable to calculate at least one frequency-dependent characteristic associated with said plurality of monitoring measurements, wherein said alarm condition further includes that said at least one frequency-dependent characteristic satisfies a threshold.

22. The device of claim 19, wherein said processor is operable to collect after a predetermined duration a plurality of calibration measurements by repeatedly measuring the electrical potential difference between two of said plurality of probes, to calculate a calibration voltage value of said plurality of calibration measurements, and to update said alarm threshold voltage based on said calibration voltage value.

23. A shock detection device comprising:
a plurality of probes for at least partially disposing in a fluid medium;
a control unit comprising:
at least one analog-to-digital signal converter in electrical communication with at least one of said plurality of probes;
at least one audio-visual alarm; and
a processor operably coupled to said at least one converter and to said at least one audio-visual alarm,
wherein said processor is operable to transmit a signal from one of said plurality of probes to another of said plurality of probes, to calculate an initial conductivity of said fluid medium based on the attenuation of the signal received by said another probe, to calculate an updated conductivity of said fluid medium after a predetermined duration, to compare said updated conductivity to said initial conductivity to determine whether one of said plurality of probes is fouled, and to transmit a probe-fouling signal to said at least one audio-visual alarm upon detecting a fouled probe.

24. The device of claim 23, wherein said processor is operable to determine a maximum detection distance based on said initial conductivity or said updated conductivity.

25. The device of claim 23, wherein said processor is operable to measure an electrical potential difference between two of said plurality of probes, to analyze a plurality of said measurements to detect the presence of a predetermined frequency, and to transmit an alert signal to said at least one audio-visual alarm upon detecting said predetermined frequency.

26. The device of claim 25, wherein said processor is operable to analyze said plurality of measurements by calculating at least one frequency-dependent characteristic of said plurality of measurements.

27. A method for detecting a stray electrical current comprising the steps of:
placing a plurality of probes at least partially in a fluid medium;
collecting a plurality of measurements by repeatedly measuring the electrical potential difference between two of said plurality of probes;
calculating at least one frequency-dependent characteristic of said plurality of measurements;
analyzing said at least one frequency-dependent characteristic to detect the presence of a predetermined frequency; and
transmitting, if said predetermined frequency is detected, an alarm to warn of a stray electrical current.

28. The method of claim 27, wherein said predetermined frequency is selected from the group consisting of 50 Hz and 60 Hz.

29. The method of claim 27 further comprising:
applying, before said analyzing step, at least one filter that reduces the amount of noise in said plurality of measurements.

30. The method of claim 27, wherein said at least one frequency-dependent characteristic is the number of peak amplitudes, the timing of peak amplitudes, the number of trough amplitudes, the timing of trough amplitudes, the number of zero crossings, the timing of zero crossings, or the slope of a portion of said plurality of measurements.

31. The method of claim 27, wherein said analyzing step further comprises calculating an amplitude associated with said plurality of measurements and comparing said calculated amplitude to an alarm threshold amplitude.

32. The method of claim 31 further comprising an initialization sequence comprising the steps of:
collecting a plurality of initialization measurements by repeatedly measuring the electrical potential difference between two of said plurality of probes;
calculating the amplitude of said plurality of initialization measurements; and
determining said alarm threshold amplitude based on the amplitude of said plurality of initialization measurements.

33. The method of claim 31, further comprising a calibration sequence comprising the steps of:
collecting, after a predetermined duration, a plurality of calibration measurements by repeatedly measuring the electrical potential difference between two of said plurality of probes;

calculating the amplitude of said plurality of calibration measurements; and determining a new value for said alarm threshold amplitude based on the amplitude of said plurality of calibration measurements.

34. The method of claim 27, wherein said placing step comprises placing two of said plurality of probes at a predetermined distance apart, said method further comprising the steps of:

transmitting a signal to one of said two probes;

receiving said signal at the other of said two probes;

calculating the conductivity of said fluid medium based on the attenuation of said received signal; and determining a maximum detection distance based on said conductivity.

35. A method for detecting a stray electrical current comprising the steps of:

placing a plurality of probes at least partially in a fluid medium;

collecting a plurality of initialization measurements by repeatedly measuring the electrical potential difference between two of said plurality of probes;

calculating an initialization voltage value of said plurality of initialization measurements;

determining an alarm threshold based on said initialization voltage value;

collecting a plurality of monitoring measurements by repeatedly measuring the electrical potential difference between two of said plurality of probes;

calculating a monitoring voltage value of said plurality of monitoring measurements;

determining the presence of a stray current by at least comparing said monitoring voltage value to said alarm threshold; and transmitting an alarm if said stray current is detected.

36. The method of claim 35, further comprising:

collecting, after a predetermined duration, a plurality of calibration measurements by repeatedly measuring the electrical potential difference between two of said plurality of probes;

calculating a calibration voltage value of said plurality of calibration measurements; and updating said alarm threshold based on said calibration voltage value.

37. The method of claim 35 further comprising:

calculating at least one frequency-dependent characteristic of said plurality of monitoring measurements, wherein said determining step further includes comparing said at least one frequency-dependent characteristic to a frequency threshold.

38. The method of claim 35, wherein said initialization voltage value is a maximum voltage, a mean voltage, or an absolute voltage of said plurality of initialization measurements.

* * * * *

UNITED STATES PATENT AND TRADEMARK OFFICE
CERTIFICATE OF CORRECTION

| | | |
|---|---|---|
| PATENT NO. | : 11,340,279 B1 | Page 1 of 1 |
| APPLICATION NO. | : 16/945564 | |
| DATED | : May 24, 2022 | |
| INVENTOR(S) | : Matthew Bruce Fitzgerald et al. | |

It is certified that error appears in the above-identified patent and that said Letters Patent is hereby corrected as shown below:

On the Title Page

Item [72], delete the first name of the inventor and insert --Arnar--.

Signed and Sealed this
Nineteenth Day of July, 2022

Katherine Kelly Vidal
*Director of the United States Patent and Trademark Office*